United States Patent
Tong et al.

(10) Patent No.: US 11,156,638 B2
(45) Date of Patent: Oct. 26, 2021

(54) CONTACTORS WITH SIGNAL PINS, GROUND PINS, AND SHORT GROUND PINS

(71) Applicant: TEXAS INSTRUMENTS INCORPORATED, Dallas, TX (US)

(72) Inventors: Kay Chan Tong, Plano, TX (US); Hisashi Ata, Murphy, TX (US); Thiha Shwe, Murphy, TX (US); Felix Martinez, Stockton, CA (US); Jonathan Hsu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 596 days.

(21) Appl. No.: 15/873,815

(22) Filed: Jan. 17, 2018

(65) Prior Publication Data
US 2019/0204357 A1 Jul. 4, 2019

Related U.S. Application Data (60) Provisional application No. 62/612,401, filed on Dec. 30, 2017.

(51) Int. Cl.
*G01R 1/04* (2006.01)
*G01R 1/067* (2006.01)
(Continued)

(52) U.S. Cl.
CPC ......... *G01R 1/07307* (2013.01); *G01R 1/045* (2013.01); *G01R 1/0466* (2013.01); *G01R 1/06766* (2013.01); *G01R 3/00* (2013.01); *G01R 31/2886* (2013.01); *H01L 22/14* (2013.01); *H01L 23/13* (2013.01); *H01L 23/49827* (2013.01); *H01L 23/49838* (2013.01); *H01L 23/66* (2013.01); *H05K 1/0228* (2013.01); *H05K 1/111* (2013.01); *H05K 1/181* (2013.01);
(Continued)

(58) Field of Classification Search
CPC .......... G01R 1/04; G01R 1/067; G01R 1/073; G01R 31/28; G01R 31/2886; G01R 31/2889; G01R 3/00; H01L 23/02; H01L 23/13; H01L 23/48; H01L 23/498; H01L 23/66
See application file for complete search history.

(56) References Cited

U.S. PATENT DOCUMENTS 6,970,362 B1 * 11/2005 Chakravorty ........... H01L 23/50
257/E23.079
7,566,960 B1 * 7/2009 Conn .................... H01L 23/055
257/678

(Continued)

*Primary Examiner* — Neel D Shah
(74) *Attorney, Agent, or Firm* — Ronald O. Neerings; Charles A. Brill; Frank D. Cimino (57) ABSTRACT

A system comprises: a contactor having a first surface, a second surface, a first hole, a second hole parallel to the first hole, and a third hole parallel to the first hole; a first signal pin held in the first hole of the contactor, extending to at least the second surface of the contactor, and extending to at least the first surface of the contactor; a first short ground pin held in the second hole of the contactor, extending to at least the second surface of the contactor, and extending within the first surface of the contactor; and a ground pin held in the third hole of the contactor, extending to at least the second surface of the contactor, and extending to at least the first surface of the contactor.

19 Claims, 8 Drawing Sheets

(51) Int. Cl.
*G01R 1/073* (2006.01)
*G01R 31/28* (2006.01)
*G01R 3/00* (2006.01)
*H01L 23/02* (2006.01)
*H01L 23/13* (2006.01)
*H01L 23/498* (2006.01)
*H05K 1/11* (2006.01)
*H05K 1/18* (2006.01)
*H01L 23/66* (2006.01)
*H05K 1/02* (2006.01)
*H01L 21/66* (2006.01)

(52) U.S. Cl.
CPC ................. *H01L 2223/6616* (2013.01); *H01L 2223/6655* (2013.01); *H05K 2201/10098* (2013.01); *H05K 2201/10378* (2013.01); *H05K 2201/10636* (2013.01); *H05K 2201/10734* (2013.01)

(56) References Cited

U.S. PATENT DOCUMENTS

| | | | | |
|---|---|---|---|---|
| 2003/0001287 A1* | 1/2003 | Sathe | ................ | H01L 23/49811 257/780 |
| 2011/0298119 A1* | 12/2011 | Cho | ................... | H01L 23/3128 257/686 |
| 2015/0309114 A1* | 10/2015 | Barabi | ................ | G01R 1/0458 324/750.03 |

* cited by examiner

CONTACTORS WITH SIGNAL PINS, GROUND PINS, AND SHORT GROUND PINS

CROSS-REFERENCE TO RELATED APPLICATIONS

The present application claims priority to U.S. Provisional Patent Application No. 62/612,401, which was filed Dec. 30, 2017, is titled "Contactors With Signal Pins, Ground Pins, And Short Ground Pins," and is hereby incorporated herein by reference in its entirety.

BACKGROUND

In many test systems for testing packaged integrated circuits using automated test equipment (ATE), the packaged integrated circuits are positioned to make electrical contact with a contactor. The contactor includes various pins to make electrical contact with a packaged integrated circuit, where an ATE is coupled to the contactor to measure various signal parameters of the packaged integrated circuit according to a test procedure. For integrated circuits designed for radio frequency (RF) applications, it is desirable to design the contactor to mitigate RF crosstalk and interference that may affect testing of the integrated circuits.

SUMMARY

In accordance with a first set of embodiments, a system comprises: a contactor having a first surface, a second surface, a first hole, a second hole parallel to the first hole, and a third hole parallel to the first hole; a first signal pin held in the first hole of the contactor, extending to at least the second surface of the contactor, and extending to at least the first surface of the contactor; a first short ground pin held in the second hole of the contactor, extending to at least the second surface of the contactor, and extending within the first surface of the contactor; and a ground pin held in the third hole of the contactor, extending to at least the second surface of the contactor, and extending to at least the first surface of the contactor.

In accordance with the first set of embodiments, in the system, the contactor comprises a plate to receive an integrated circuit package.

In accordance with the first set of embodiments, in the system, the second hole is separated from the first hole by not more than 100 microns.

In accordance with the first set of embodiments, the system further comprises a circuit board, the circuit board comprising: a signal pad in electrical contact with the first signal pin; a first ground pad in electrical contact with the first short ground pin; and a second ground pad in electrical contact with the ground pin.

In accordance with the first set of embodiments, the system further comprises a ground at ground potential, the ground in electrical contact with the second ground pad of the circuit board.

In accordance with the first set of embodiments, the system further comprises a radio frequency generator comprising an output port coupled to the signal pad of the circuit board and to the first ground pad of the circuit board.

In accordance with the first set of embodiments, the system further comprises a device comprising a signal pad in electrical contact with the first signal pin and a ground pad in electrical contact with the ground pin.

In accordance with the first set of embodiments, in the system, the device comprises: a ball grid array integrated circuit package; and a signal ball on the ball grid array integrated circuit package and forming the signal pad of the device.

In accordance with the first set of embodiments, in the system, the device comprises: a quad flatpack no leads integrated circuit package; and a signal device pin on the quad flatpack no leads integrated circuit package and forming the signal pad of the device.

In accordance with the first set of embodiments, in the system, the contactor has a fourth hole parallel to the first hole, the system further comprising a second short ground pin held in the fourth hole of the contactor, extending to at least the second surface of the contactor, and extending within the first surface of the contactor.

In accordance with the first set of embodiments, the system further comprises a circuit board, the circuit board comprising: a signal pad in electrical contact with the first signal pin; a first ground pad in electrical contact with the first short ground pin; a second ground pad in electrical contact with the second short ground pin; and a third ground pad in electrical contact with the ground pin.

In accordance with the first set of embodiments, the system further comprises a ground at ground potential, the ground in electrical contact with the third ground pad of the circuit board.

In accordance with the first set of embodiments, the system further comprises a radio frequency generator comprising an output port coupled to the signal pad of the circuit board, to the first ground pad of the circuit board, and to the second ground pad of the circuit board.

In accordance with the first set of embodiments, the system further comprises a device comprising a signal pad in electrical contact with the first signal pin and a ground pad in electrical contact with the ground pin.

In accordance with the first set of embodiments, in the system, the contactor has a fifth hole parallel to the first hole, the system further comprising a second signal pin held in the fifth hole of the contactor, extending to at least the second surface of the contactor, and extending to at least the first surface of the contactor.

In accordance with the first set of embodiments, in the system, the second hole is separated from the first hole by not more than 100 microns, the fourth hole is separated from the fifth hole by not more than 100 microns, and the fifth hole is separated from the first hole by not more than 100 microns.

In accordance with the first set of embodiments, in the system further comprises a circuit board, the circuit board comprising: a signal pad in electrical contact with the first signal pin and the second signal pin; a first ground pad in electrical contact with the first short ground pin; a second ground pad in electrical contact with the second short ground pin; and a third ground pad in electrical contact with the ground pin.

In accordance with the first set of embodiments, in the system further comprises a device comprising a signal pad in electrical contact with the first signal pin and the second signal pin, and a ground pad in electrical contact with the ground pin.

In accordance with a second set of embodiments, a system comprises: a contactor having a first surface, a second surface, a first hole and a second hole parallel to the first hole, the contactor comprising a metal block, the metal block extending to the second surface of the contactor and extending within the first surface of the contactor, the metal block having a hole aligned with the second hole of the contactor, and a side parallel to the first hole of the contactor;

a first signal pin held in the first hole of the contactor, extending to at least the second surface of the contactor, and extending to at least the first surface of the contactor; and a ground pin held in the hole of the metal block and in electrical contact with the metal block, the ground pin extending to at least the second surface of the contactor, and extending to at least the first surface of the contactor.

In accordance with the second set of embodiments, in the system, the contactor comprises a plate to receive an integrated circuit package.

In accordance with the second set of embodiments, in the system, the side of the metal block is separated from the first hole of the contactor by not more than 100 microns.

In accordance with the second set of embodiments, in the system, the contactor comprises a third hole parallel to the first hole, the system further comprising a short ground pin held in the third hole of the contactor, extending to at least the second surface of the contactor, and extending within the first surface of the contactor.

In accordance with the second set of embodiments, in the system, the third hole is separated from the first hole of the contactor by not more than 100 microns, and wherein a side of the metal block is separated from the first hole of the contactor by not more than 100 microns.

In accordance with the second set of embodiments, the system further comprises a circuit board, the circuit board comprising: a signal pad in electrical contact with the first signal pin; a first ground pad in electrical contact with the ground pin; and a second ground pad in electrical contact with the short ground pin.

In accordance with the second set of embodiments, the system further comprises a ground at ground potential, the ground in electrical contact with the first ground pad of the circuit board.

In accordance with the second set of embodiments, the system further comprises a radio frequency generator comprising an output port coupled to the signal pad of the circuit board and to the second ground pad of the circuit board.

In accordance with the second set of embodiments, the system further comprises a device comprising a signal pad in electrical contact with the first signal pin and a ground pad in electrical contact with the ground pin.

In accordance with the second set of embodiments, in the system, the device comprises: a ball grid array integrated circuit package; and a signal ball on the ball grid array integrated circuit package and forming the signal pad of the device.

In accordance with the second set of embodiments, in the system, the device comprises: a quad flatpack noleads integrated circuit package; and a signal device pin on the quad flatpack no leads integrated circuit package and forming the signal pad of the device.

In accordance with the second set of embodiments, in the system, the contactor comprises a third hole parallel to the first hole, the system further comprising a second signal pin held in the third hole of the contactor, extending to at least the second surface of the contactor, and extending to at least the first surface of the contactor.

In accordance with the second set of embodiments, the system further comprises a circuit board, the circuit board comprising: a signal pad in electrical contact with the first signal pin and the second signal pin; and a first ground pad in electrical contact with the ground pin.

In accordance with the second set of embodiments, the system further comprises a radio frequency generator comprising an output port coupled to the signal pad of the circuit board and to the first ground pad of the circuit board.

In accordance with the second set of embodiments, the system further comprises a device comprising a signal pad in electrical contact with the first signal pin and the second signal pin, and a ground pad in electrical contact with the ground pin.

In accordance with the second set of embodiments, in the system, the contactor comprises a fourth hole parallel to the first hole, the system further comprising a short ground pin held in the fourth hole of the contactor, extending to at least the second surface of the contactor, and extending within the first surface of the contactor.

In accordance with the second set of embodiments, in the system, the third hole is separated from the first hole of the contactor by not more than 100 microns, and the fourth hole is separated from the third hole of the contactor by not more than 100 microns.

In accordance with the second set of embodiments, the system further comprises a circuit board, the circuit board comprising: a signal pad in electrical contact with the first signal pin and the second signal pin; a first ground pad in electrical contact with the ground pin; and a second ground pad in electrical contact with the short ground pin.

In accordance with the second set of embodiments, the system further comprises a radio frequency generator comprising an output port coupled to the signal pad of the circuit board, and to the second ground pad of the circuit board.

In accordance with a third set of embodiments, a system comprises: a contactor having a first surface, a second surface, a first hole, a second hole parallel to the first hole, and a third hole parallel to the first hole, the contactor comprising a metal plane, the metal plane having a first hole aligned with the first hole of the contactor, a second hole aligned with the second hole of the contactor, and a third hole aligned with the third hole of the contactor; a first signal pin held in the first hole of the contactor, extending to at least the second surface of the contactor, and extending to at least the first surface of the contactor, wherein the first signal pin is electrically insulated from the metal plane; and a ground pin held in the third hole of the contactor, extending to at least the second surface of the contactor, and extending to at least the first surface of the contactor, wherein the ground pin is in electrical contact with the metal plane.

In accordance with the third set of embodiments, in the system, the contactor comprises a plate to receive an integrated circuit package.

In accordance with the third set of embodiments, the system further comprises a second signal pin held in the second hole of the contactor, extending to at least the second surface of the contactor, and extending to at least the first surface of the contactor, wherein the second signal pin is electrically insulated from the metal plane.

In accordance with the third set of embodiments, in the system, the first hole is separated from the second hole by not more than 100 microns.

In accordance with the third set of embodiments, the system further comprises a circuit board, the circuit board comprising: a signal pad in electrical contact with the first signal pin and the second signal pin; and a first ground pad in electrical contact with the ground pin.

In accordance with the third set of embodiments, the system further comprises a ground at ground potential, the ground in electrical contact with the first ground pad of the circuit board.

In accordance with the third set of embodiments, the system further comprises a radio frequency generator comprising an output port coupled to the signal pad of the circuit board and to the first ground pad of the circuit board.

In accordance with the third set of embodiments, the system further comprises a device comprising a signal pad in electrical contact with the first signal pin and the second signal pin, and a ground pad in electrical contact with the ground pin.

In accordance with the third set of embodiments, the system further comprises: a first insulating sleeve inserted in the first hole of the contactor, wherein the first signal pin is inserted in the first insulating sleeve; and a second insulating sleeve inserted in the second hole of the contactor, wherein the second signal pin is inserted in the second insulating sleeve.

In accordance with the third set of embodiments, the system further comprises a short ground pin held in the second hole of the contactor, extending to at least the second surface of the contactor, and extending within the first surface of the contactor, wherein the short ground pin is in electrical contact with the metal plane.

In accordance with the third set of embodiments, the system further comprises a circuit board, the circuit board comprising: a signal pad in electrical contact with the first signal pin; a first ground pad in electrical contact with the ground pin; and a second ground pad in electrical contact with the short ground pin.

In accordance with the third set of embodiments, the system further comprises a radio frequency generator comprising an output port coupled to the signal pad of the circuit board and the second ground pad of the circuit board.

In accordance with the third set of embodiments, the system further comprises a device comprising a signal pad in electrical contact with the first signal pin, and a ground pad in electrical contact with the ground pin.

In accordance with the third set of embodiments, the system further comprises an insulating sleeve inserted in the first hole of the contactor, wherein the first signal pin is inserted in the insulating sleeve.

In accordance with the third set of embodiments, in the system, the first hole of the contactor and the first hole of the metal plane have a same first radius, the second hole of the contactor and the second hole of the metal plane have a same second radius, and a radius of the third hole of the contactor is larger than a radius of the third hole of the metal plane.

In accordance with the third set of embodiments, in the system, the first radius and the second radius are each larger than the radius of the third hole of the metal plane.

In accordance with a fourth set of embodiments, a system comprises a contactor, the contactor having a first surface, a second surface, a third surface, a fourth surface, a fifth surface, a sixth surface, a first hole, and a second hole parallel to the first hole, the contactor comprising: a metal plane having a first hole aligned with the first hole of the contactor; a metal block, the metal block extending to the second surface of the contactor, extending within the first surface of the contactor, having a side parallel to the first hole of the contactor, having a hole aligned with the second hole of the contactor, and wherein the metal block is in electrical contact with the metal plane; a first metal wall parallel to the third surface, the first metal wall extending to the second surface of the contactor, and extending within the first surface of the contactor; a second metal wall in electrical contact with the first metal wall and parallel to the fourth surface, the second metal wall extending to the second surface of the contactor, and extending within the first surface of the contactor; a third metal wall in electrical contact with the first metal wall and parallel to the fifth surface, the third metal wall extending to the second surface of the contactor, and extending within the first surface of the contactor; a fourth metal wall in electrical contact with the first metal wall and parallel to the sixth surface, the fourth metal wall extending to the second surface of the contactor, and extending within the first surface of the contactor; wherein the first, second, third, and fourth metal walls intersect to surround sides of the metal block; a first signal pin held in the first hole of the contactor, extending to at least the second surface of the contactor, and extending to at least the first surface of the contactor, wherein the first signal pin is electrically insulated from the metal plane; and a ground pin held in the hole of the metal block, extending to at least the second surface of the contactor, and extending to at least the first surface of the contactor, wherein the ground pin is in electrical contact with the metal block.

In accordance with the fourth set of embodiments, in the system, the contactor comprises a plate to receive an integrated circuit package.

In accordance with the fourth set of embodiments, in the system, the side of the metal block and the first hole of the contactor are separated by not more than 100 microns.

In accordance with the fourth set of embodiments, the system further comprises a circuit board, the circuit board comprising: a signal pad in electrical contact with the first signal pin; and a ground pad in electrical contact with the ground pin.

In accordance with the fourth set of embodiments, the system further comprises a ground at ground potential, the ground in electrical contact with the ground pad of the circuit board.

In accordance with the fourth set of embodiments, the system further comprises a radio frequency generator comprising an output port coupled to the signal pad of the circuit board and the ground pad of the circuit board.

In accordance with the fourth set of embodiments, in the system, the first hole of the contactor is separated from the side of the metal block by not more than 100 microns.

In accordance with the fourth set of embodiments, the system further comprises a device comprising a signal pad in electrical contact with the first signal pin, and a ground pad in electrical contact with the ground pin.

In accordance with the fourth set of embodiments, in the system, the contactor has a third hole parallel to the first hole, wherein the metal plane has a second hole aligned with the third hole of the contactor, the system further comprising: a second signal pin held in the third hole of the contactor, extending to at least the second surface of the contactor, and extending to at least the first surface of the contactor, wherein the second signal pin is electrically insulated from the metal plane.

In accordance with the fourth set of embodiments, in the system, the first hole of the contactor is separated from the side of the metal block by not more than 100 microns, and the first hole of the contactor is separated from the third hole by not more than 100 microns.

In accordance with the fourth set of embodiments, the system further comprises a circuit board, the circuit board comprising: a signal pad in electrical contact with the first signal pin and the second signal pin; and a ground pad in electrical contact with the ground pin.

In accordance with the fourth set of embodiments, the system further comprises a device comprising a signal pad in electrical contact with the first signal pin and with the second signal pin, and a ground pad in electrical contact with the ground pin.

In accordance with a fifth set of embodiments, a method of manufacture comprises: placing a packaged integrated circuit in contact with a contactor; and placing the packaged integrated circuit in electrical contact with a first signal pin and a ground pin; wherein the contactor has a first surface, a second surface, a first hole, a second hole parallel to the first hole, and a third hole parallel to the first hole; wherein the first signal pin is held in the first hole of the contactor, extends to at least the second surface of the contactor, and extends to at least the first surface of the contactor; wherein the ground pin is held in the third hole of the contactor, extends to at least the second surface of the contactor, and extends to at least the first surface of the contactor; and wherein the contactor includes a first short ground pin held in the second hole of the contactor, extends to at least the second surface of the contactor, and extends within the first surface of the contactor.

In accordance with a sixth set of embodiments, a method of manufacture comprises: placing a packaged integrated circuit in contact with a contactor; and placing the packaged integrated circuit in electrical contact with a first signal pin and a ground pin; wherein the contactor has a first surface, a second surface, a first hole and a second hole parallel to the first hole, wherein the contactor comprises a metal block, the metal block extending to the second surface of the contactor and extending within the first surface of the contactor, the metal block having a hole aligned with the second hole of the contactor, and wherein the contactor includes a side parallel to the first hole of the contactor; wherein the first signal pin is held in the first hole of the contactor, extends to at least the second surface of the contactor, and extends to at least the first surface of the contactor; and wherein the ground pin is held in the hole of the metal block and in electrical contact with the metal block, extends to at least the second surface of the contactor, and extends to at least the first surface of the contactor.

In accordance with a seventh set of embodiments, a method of manufacture comprises: placing a packaged integrated circuit in contact with a contactor; and placing the packaged integrated circuit in electrical contact with a first signal pin and a ground pin; wherein the contactor has a first surface, a second surface, a first hole, a second hole parallel to the first hole, and a third hole parallel to the first hole, wherein the contactor comprises a metal plane; wherein the metal plane has a first hole aligned with the first hole of the contactor, a second hole aligned with the second hole of the contactor, and a third hole aligned with the third hole of the contactor; wherein the first signal pin is held in the first hole of the contactor, extends to at least the second surface of the contactor, and extends to at least the first surface of the contactor, wherein the first signal pin is electrically insulated from the metal plane; and wherein the ground pin is held in the third hole of the contactor, extends to at least the second surface of the contactor, and extends to at least the first surface of the contactor, wherein the ground pin is in electrical contact with the metal plane.

In accordance with an eighth set of embodiments, a method of manufacture comprises: placing a packaged integrated circuit in contact with a contactor; and placing the packaged integrated circuit in electrical contact with a first signal pin and a ground pin; wherein the contactor has a first surface, a second surface, a third surface, a fourth surface, a fifth surface, a sixth surface, a first hole, and a second hole parallel to the first hole, wherein the contactor comprises a metal plane, a metal block, a first metal wall, a second metal wall, a third metal wall, and a fourth metal wall: wherein the metal plane has a first hole aligned with the first hole of the contactor; wherein the metal block extends to the second surface of the contactor, extends within the first surface of the contactor, has a side parallel to the first hole of the contactor, has a hole aligned with the second hole of the contactor, and wherein the metal block is in electrical contact with the metal plane; wherein the first metal wall is parallel to the third surface, extends to the second surface of the contactor, and extends within the first surface of the contactor; wherein the second metal wall is in electrical contact with the first metal wall and is parallel to the fourth surface, extends to the second surface of the contactor, and extends within the first surface of the contactor; wherein the third metal wall is in electrical contact with the first metal wall and is parallel to the fifth surface, extends to the second surface of the contactor, and extends within the first surface of the contactor; wherein the fourth metal wall is in electrical contact with the first metal wall and is parallel to the sixth surface, extends to the second surface of the contactor, and extends within the first surface of the contactor; wherein the first, second, third, and fourth metal walls intersect to surround sides of the metal block; wherein the first signal pin is held in the first hole of the contactor, extends to at least the second surface of the contactor, and extends to at least the first surface of the contactor, wherein the first signal pin is electrically insulated from the metal plane; and wherein the ground pin is held in the hole of the metal block, extends to at least the second surface of the contactor, and extends to at least the first surface of the contactor, wherein the ground pin is in electrical contact with the metal block.

BRIEF DESCRIPTION OF THE DRAWINGS

For a detailed description of various examples, reference will now be made to the accompanying drawings in which.

DETAILED DESCRIPTION

Standard contactors for low frequency test requirements of a packaged integrated circuit typically use engineered plastic socket housings to hold pins to establish temporary electrical connections between a test board and the packaged integrated circuit. Such contactors are relatively low cost, but because they are designed for low frequency applications, they may be problematic in testing integrated circuits in the radio frequency range, for example at frequencies in the GHz range. For RF test requirements, often complex and relatively expensive coaxial structures are employed to provide impedance matching of transmission lines, noise shielding, and RF interference mitigation. It is desirable to provide contactors that are suitable for RF testing of integrated circuits, but that share the relatively low manufacturing costs of standard contactors for low frequency applications.

In accordance with the disclosed embodiments, an illustrative contactor includes a signal pin parallel with a short ground pin. The short ground pin does not make contact with the device under test, but is grounded at the test board (circuit board). The short ground pin is positioned relatively close to the signal pin compared to the operating wavelength, for example from 50 microns to 60 microns. The combination of the signal pin and short ground pin helps mitigate RF interference. Manufacturing of the signal pin and ground pin, and the contactor that holds them, can share the same tooling used in standard contactors for low frequency testing, thereby reducing manufacturing costs. In other embodiments, metal planes in an illustrative contactor may be used, where the metal planes surround the signal pins, short ground pins, and ground pins to mitigate RF interference. In some embodiments, metal blocks in an illustrative contactor may be used, where the metal blocks are in contact with ground pins, and have a side positioned near the signal pins to mitigate RF interference.

Figure 1:
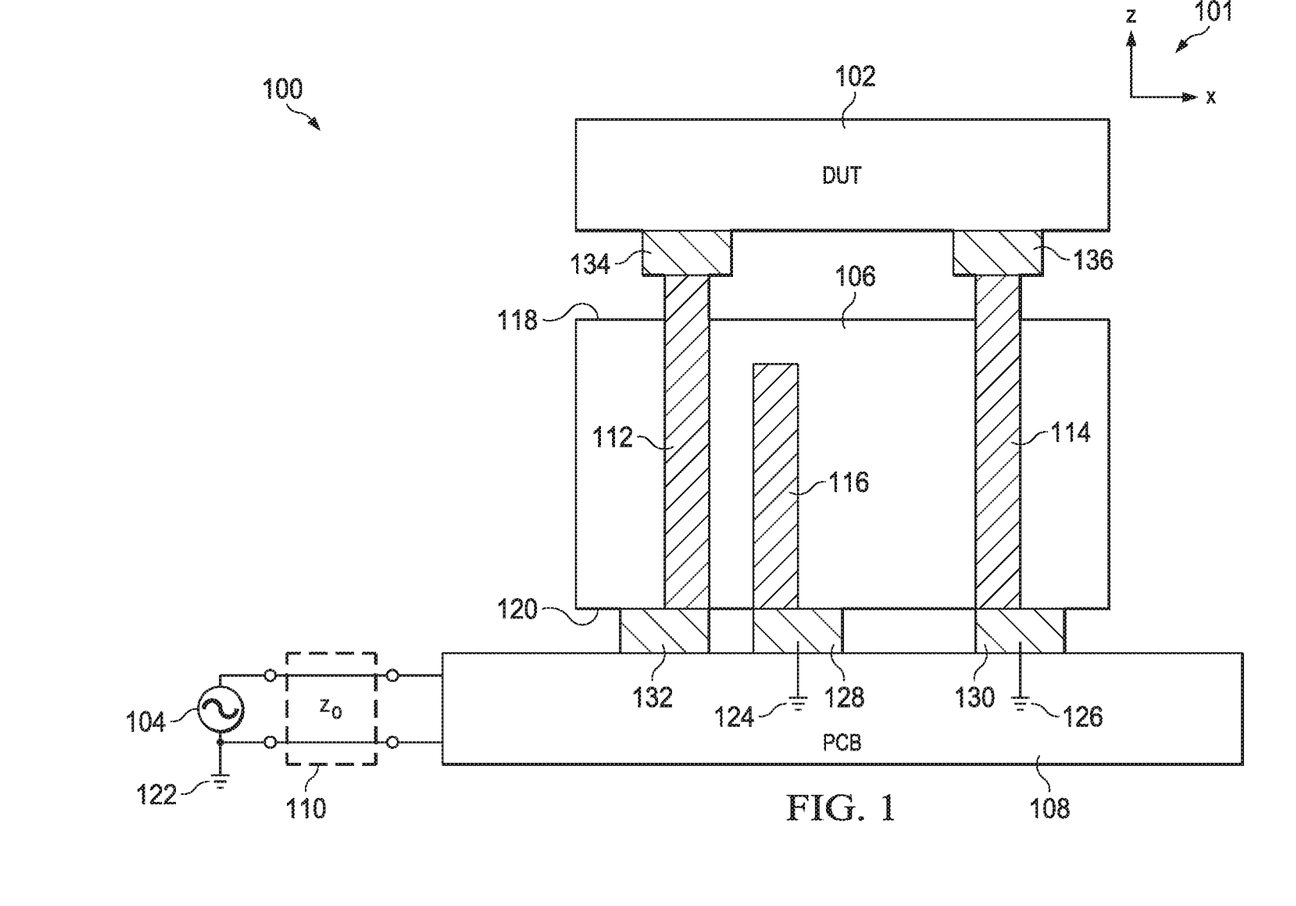
FIG. 1 shows an illustrative system in accordance with various examples.

FIG. 1 shows an illustrative system 100 to test a device 102, referred to as a device-under-test (DUT) 102. The DUT 102 is a packaged integrated circuit with some or all of its circuitry operational at RF (radio frequency). During a test, an output port of an RF generator is coupled to various pins of the DUT 102 to drive the DUT 102 with one or more RF signals according to a test procedure, and an input port of an RF receiver is coupled to various pins of the DUT 102 to sense one or more signals provided by the DUT 102. FIG. 1 shows an RF generator 104, represented as a voltage source. An RF receiver is not shown in FIG. 1.

In an automated test environment, the DUT 102 is coupled to the RF generator 104 by way of a contactor 106, a circuit board 108, and a transmission line 110. The RF generator 104 and the transmission line 110 may be on the circuit board 108. The circuit board 108 comprises one or more transmission lines (not shown), such as striplines. The contactor 106 may be referred to as a pin block or pin module, and comprises one or more components having holes in which pins are inserted.

FIG. 1 presents a simplified cross-sectional view of the contactor 106 showing a signal pin 112, a ground pin 114, and a pin 116. The pin 116 does not extend to a first surface 118 of the contactor 106. The pin 116 will be referred to as a short ground pin 116, and may be described as extending within the first surface 118 of the contactor 106. The short ground pin 116 extends to a second surface 120 of the contactor 106. In some embodiments, the short ground pin 116 can extend beyond the second surface 120 of the contactor 106, so that the short ground pin 116 may be described as extending to at least the second surface 120 of the contactor 106. However, as described further, the short ground pin 116 is in contact with the circuit board 108.

The signal pin 112, the ground pin 114, and the short ground pin 116 each fit into respective holes formed in the contactor 106. FIG. 1 does not show these holes. Although the short ground pin 116 does not extend to the first surface 118, the hole in which it is inserted into may completely extend through the contactor 106, extending from the second surface 120 to the first surface 118. Furthermore, the ordering of the signal pin 112, the short ground pin 116, and the ground pin 114 from left to right in FIG. 1 does not imply a particular ordering. Their relative positions may be interchanged, where for example the short ground pin 116 may be to the left of the signal pin 112 so that the signal pin 112 is positioned between the short ground pin 116 and the ground pin 114.

FIG. 1 shows three grounds: a ground 122, a ground 124, and a ground 126.

The ground 124 grounds a pad 128 on the circuit board 108, where the short ground pin 116 is in electrical contact with the pad 128. The ground 126 grounds a pad 130 on the circuit board 108, where the ground pin 114 is in electrical contact with the pad 130. The grounds 122, 124, and 126 are separately labeled to indicate that they may not necessarily be at the same voltage potential (or the same physical ground). Although the grounds 122, 124, and 126 may be electrically connected to each other, depending upon the wavelength of the output provided by the RF generator 104 relative to their physical spacing, and depending upon the layout of the transmission lines, there may be phase differences in their voltage potentials.

A pad 132 on the circuit board 108 is in electrical contact with the signal pin 112. The transmission line 110 (for example, a conductor making up part of the transmission line 110) is coupled to the signal pin 112, although FIG. 1 does not explicitly show this coupling. A signal pad 134 on the DUT 102 is in electrical contact with the signal pin 112, and a ground pad 136 on the DUT 102 is in electrical contact with the ground pin 114. Because the short ground pin 116 only extends to within the first surface 118 of the contactor 106, it does not make electrical contact with the DUT 102.

For the signal pin 112 to make electrical contact with the signal pad 134, the signal pin 112 may extend beyond the first surface 118 of the contactor 106. For some embodiments, the signal pin 112 may extend to the first surface 118. Accordingly, the signal pin 112 may be described as extending to at least the first surface 118 of the contactor 106. To make electrical contact with the pad 132, the signal pin 112 may extend beyond the second surface 120 of the contactor 106. For some embodiments, the signal pin 112 may extend to the second surface 120. Accordingly, the signal pin 112 may be described as extending to at least the second surface 120 of the contactor 106.

For the ground pin 114 to make electrical contact with the ground pad 136 on the DUT 102, the ground pin 114 may extend beyond the first surface 118 of the contactor 106. For some embodiments, the ground pin 114 may extend to the first surface 118. Accordingly, the ground pin 114 may be described as extending to at least the first surface 118 of the contactor 106. To make electrical contact with the pad 130, the ground pin 114 may extend beyond the second surface 120 of the contactor 106. For some embodiments, the ground pin 114 may extend to the second surface 120. Accordingly, the ground pin 114 may be described as extending to at least the second surface 120 of the contactor 106.

In a typical application, the contactor 106 will have many more than the three pins shown in FIG. 1, and the DUT 102 will have many more pads than the two pads shown in FIG. 1. The contactor 106 may comprise a block in which holes are drilled for the pins. Pins are inserted into and held in the holes. These pins may be cylindrical in shape, where a cross-section is similar to the rectangular shapes illustrated in FIG. 1.

The rectangular shapes illustrated in FIG. 1 represent simplified cross-sectional views of the pins. In practice, a pin may be tapered at its top and may comprise several components, such as a spring. For example, the signal pin 112 may comprise multiple components that may extend relative to one another under the tension of a spring (not shown), so that a good electrical contact may be made to the signal pad 134 of the DUT 102. Similar remarks apply to the ground pin 114. The short ground pin 116 may be manufactured in the same way as the signal pin 112 or the ground pin 114, but is shorter in length so as to extend within the first surface 118.

The DUT 102 may be any one of a number of packaged integrated circuit types. For example, the DUT 102 may be a ball grid array integrated circuit package, where a signal ball on the ball grid array integrated circuit package is identified with the signal pad 134 of the DUT 102. A ground ball on the ball grid array integrated circuit package may be identified with the ground pad 136 of the DUT 102. As another example, the DUT 102 may be a quad flatpack no leads integrated circuit package, where a signal device pin may be identified with the signal pad 134.

The tooling to manufacture the contactor 106 may borrow from tooling used for low frequency (DC) contactors. The tooling to manufacture the pins, e.g., the signal pin 112, the ground pin 114, and the short ground pin, may borrow from tooling used to manufacture Kelvin pins. A typical diameter for the pins may be about 0.3 mm, with a length of about 2 mm to 3 mm. A pin in the contactor 106 can be placed to within 100 microns or less away from another pin, a side of the contactor 106, or other structures (described later). By utilizing the same tooling available for contactors for DC applications with Kelvin pins, cost savings can be achieved.

In the high gigahertz range, the separation between the short ground pin 116 and the signal pin 112 is relatively small compared to the wavelength of the RF signal applied to the DUT 102. With the short ground pin 116 coupled to the ground 124, the structure comprising the short ground pin 116 and the signal pin 112 provides good RF shielding so that RF interference is mitigated.

Figure 2:
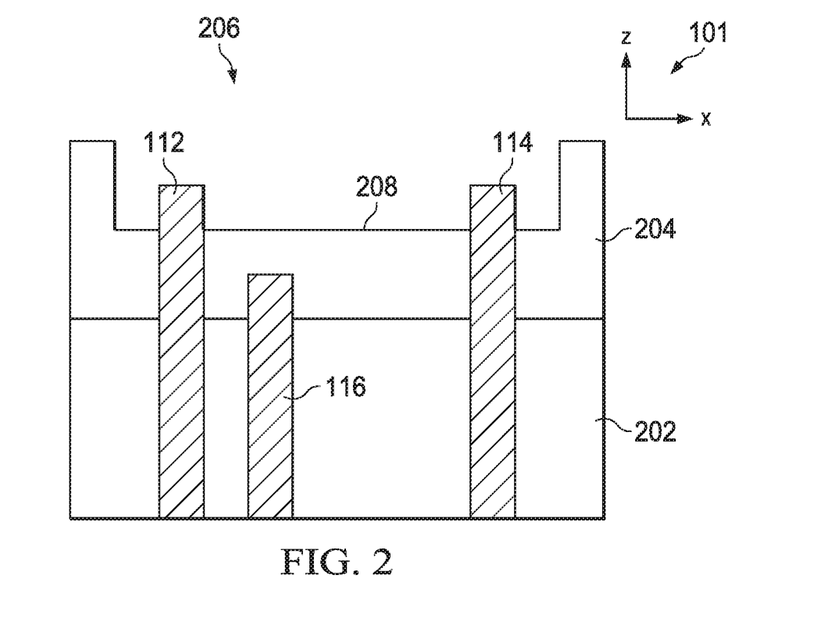
FIG. 2 shows an illustrative contactor in accordance with various examples.

In some embodiments, the contactor 106 may be manufactured so as to comprise more than one module, where individual modules may be held together. FIG. 2 shows an illustrative contactor 206, comprising a pin module 202 and a plate 204. The plate 204 is formed to receive a packaged integrated circuit. The pin module 202 and the plate 204 have aligned holes in which the pins 112, 114, and 116 are inserted. In the particular example of FIG. 2, the first surface 118 of the illustrative contactor 206 is identified with a first surface 208 of the plate 204.

FIG. 1 and FIG. 2 both illustrate a right-handed coordinate system 101, where the x-axis and z-axis of the coordinate system 101 each lie in the page of the drawing, and the y-axis points into the page of the drawing. The coordinate system 101 is illustrated in other figures so that the relative orientations of the various embodiments are easily ascertained. For example, referring to FIG. 1, the first surface 118 and the second surface 120 of the contactor 106 each lie in the x-y plane. The pins, and the holes into which they are inserted, are aligned vertically along the z-axis.

Figure 3:
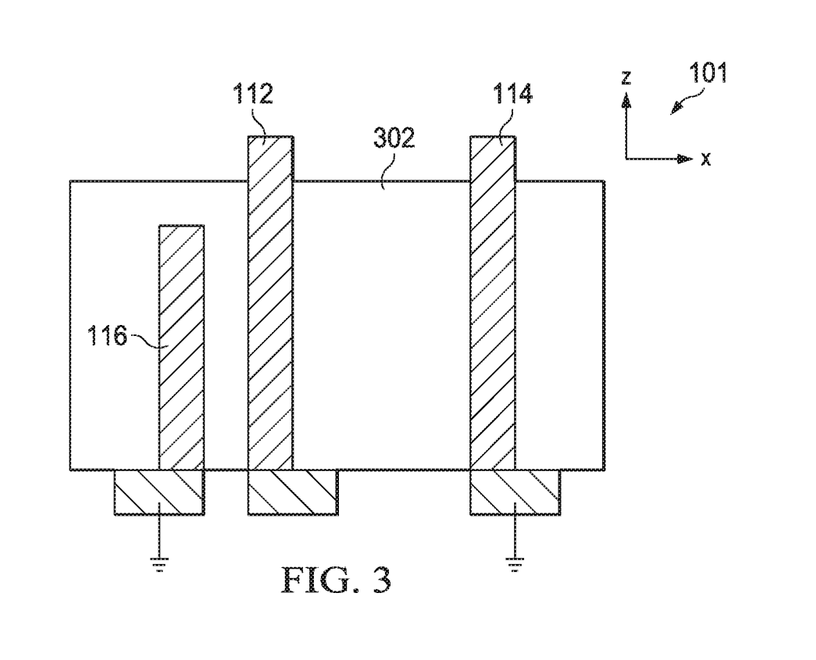
FIG. 3 shows an illustrative contactor in accordance with various examples.

FIG. 3 shows an illustrative contactor 302. The short ground pin 116 is to the left of the signal pin 112, where the signal pin 112 is disposed between the short ground pin 116 and the ground pin 114. This may be contrasted with the example of FIG. 1 where the short ground pin 116 is to the right of the signal pin 112, with the short ground pin 116 disposed between the signal pin 112 and the ground pin 114. As in the embodiment of FIG. 1, for the embodiment of FIG. 3 the signal pin 112 is separated from the short ground pin 166 by less than 100 microns.

Figure 4:
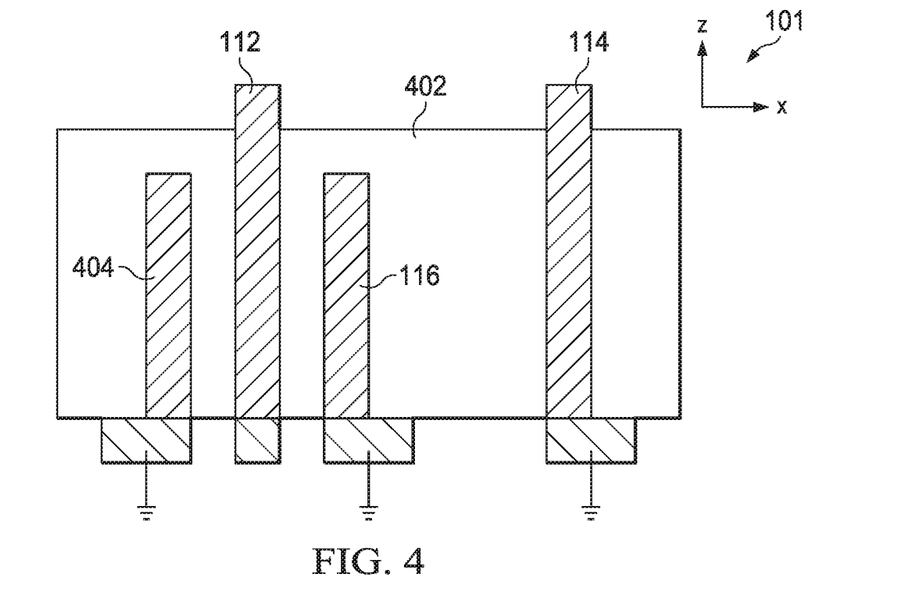
FIG. 4 shows an illustrative contactor in accordance with various examples.

FIG. 4 shows an illustrative contactor 402, where the contactor 402 has four parallel holes for inserting pins into. Inserted in three of these holes are the signal pin 112, the ground pin 114, and the short ground pin 116, as described with respect to FIG. 1. In a fourth hole, another short ground pin is inserted, referred to as a short ground pin 404. The short ground pin 404 may be identical to the short ground pin 116. The short ground pin 116 may be separated from the signal pin 112 by less than 100 microns, and the short ground pin 404 may be separated from the signal pin 112 by less than 100 microns.

Figure 5:
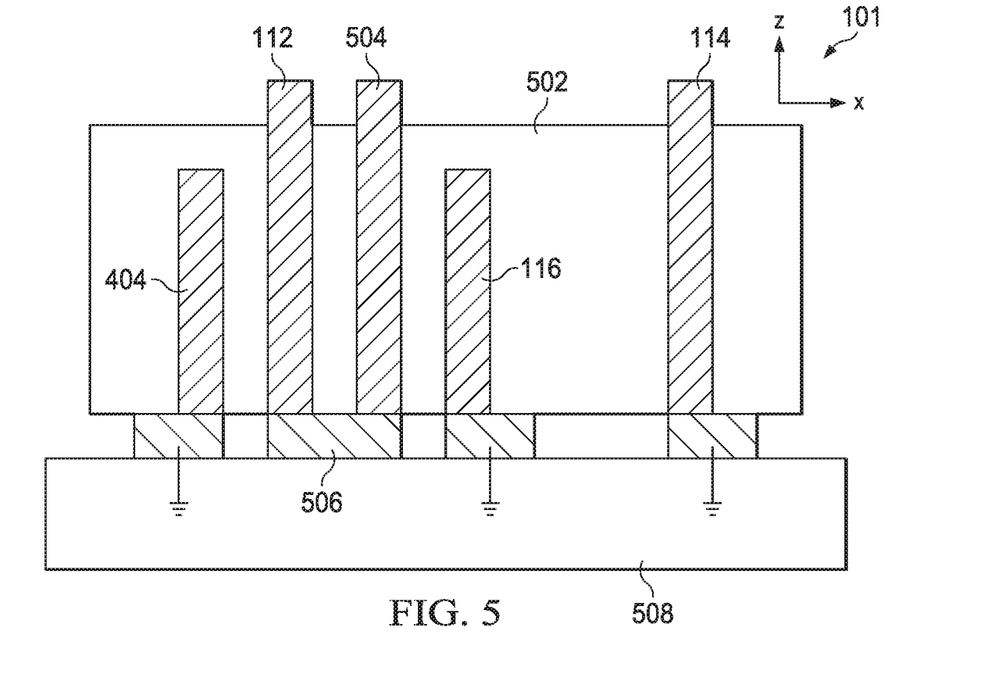
FIG. 5 shows an illustrative contactor in accordance with various examples.

FIG. 5 shows an illustrative contactor 502, where the contactor 502 has five parallel holes for inserting pins. Inserted in four of these holes are the signal pin 112, the ground pin 114, the short ground pin 116, and the short ground pin 404. In a fifth hole, another signal pin is inserted, referred to as a signal pin 504. The signal pin 504 may be identical to the signal pin 112. The separations between the short ground pin 116 and the signal pin 504, and the signal pin 112 and the short ground pin 404, may be selected based upon impedance matching. The separation between the signal pin 504 and the signal pin 112 may be less than 100 microns.

The signal pins 112 and 504 are each in electrical contact with a pad 506 on the circuit board 508. One or both of the signal pins 112 and 504 are in electrical contact with the signal pad 134 of the DUT 102 (not shown in FIG. 5).

Figure 6:
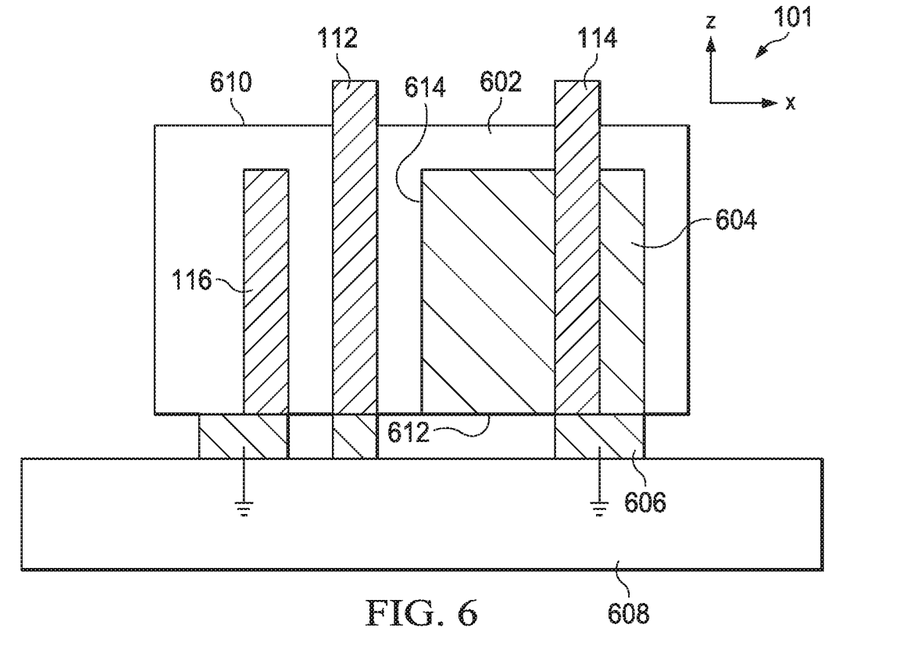
FIG. 6 shows an illustrative contactor in accordance with various examples.

FIG. 6 shows an illustrative contactor 602. The contactor 602 has three parallel holes for inserting pins, and a metal block 604. The hole in the contactor 602, for inserting the ground pin 114 into, includes a hole in the metal block 604. That is, the hole for receiving the ground pin 114 also goes through the metal block 604. This may be described as the metal block having a hole aligned with the corresponding hole of the contactor 602 for receiving the ground pin 114.

The ground pin 114 is in electrical contact with the metal block 604, where a pad 606 on the circuit board 608 grounds the ground pin 114 and the metal block 604. The sides of the metal block 604 are vertical, where they are parallel to the z-axis of the coordinate system 101. A side 614 of the metal block 604 is the side closest to the signal pin 112, and is parallel to the signal pin 112 and the holes in the contactor 602. Not all sides of the metal block 604 need be parallel. The metal block 604 extends within the first surface 610 of the contactor 602. In the particular embodiment of FIG. 6, the metal block 604 extends to a second surface 612 of the contactor 602, but also may extend beyond the second surface 612 for some embodiments.

As in the other embodiments, the signal pin 112 extends to at least the first surface 610. In the particular embodiment of FIG. 6, the signal pin 112 is shown extending beyond the first surface 610, and extends to the second surface 612 of the contactor 602. The short ground pin 116 is grounded and extends within the first surface 610. The distance of the signal pin 112 from the side 614 of the metal block 604 may be chosen based upon matching impedance. The short ground pin 116 may be separated from the signal pin 112 by less than 100 microns.

Figure 7:
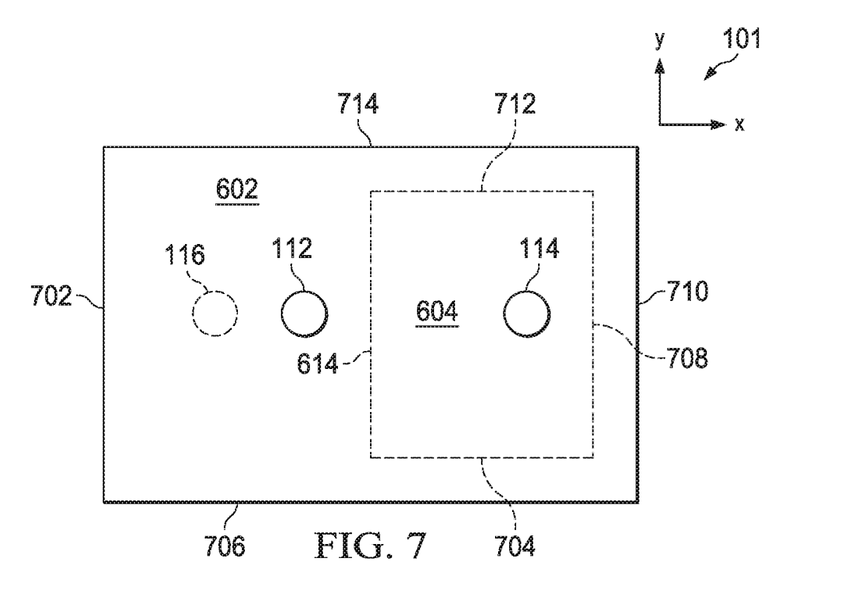
FIG. 7 shows an illustrative contactor in accordance with various examples.

FIG. 7 shows the illustrative contactor 602, but looking down into the first surface 610 as indicated by the orientation of the coordinate system 101 of FIG. 7 in which the x-axis and the y-axis lie in the page of the drawing, and the z-axis points out of the page of the drawing. The side 614 of the metal block 604 is parallel to a side 702 of the contactor 602 and to the signal pin 112 (as well as parallel to the hole, not shown, for the signal pin 112). A side 704 of the metal block 604 is parallel to a side 706 of the contactor 602. A side 708 of the metal block 604 is parallel to a side 710 of the contactor 602. A backside 712 of the metal block 604 is parallel to a backside 714 of the contactor 602. A first surface of the metal block 604 is parallel to the x-y plane. The first surface of the metal block 604 may be positioned below the first surface 610 of the contactor 602. In some embodiments, the sides 704, 708, and 712 of the metal block 604 may extend to their corresponding sides of the contactor 602, but in the particular embodiment of FIG. 7 these sides of the metal block 604 do not extend all the way to their corresponding sides of the contactor 602.

Figure 8:
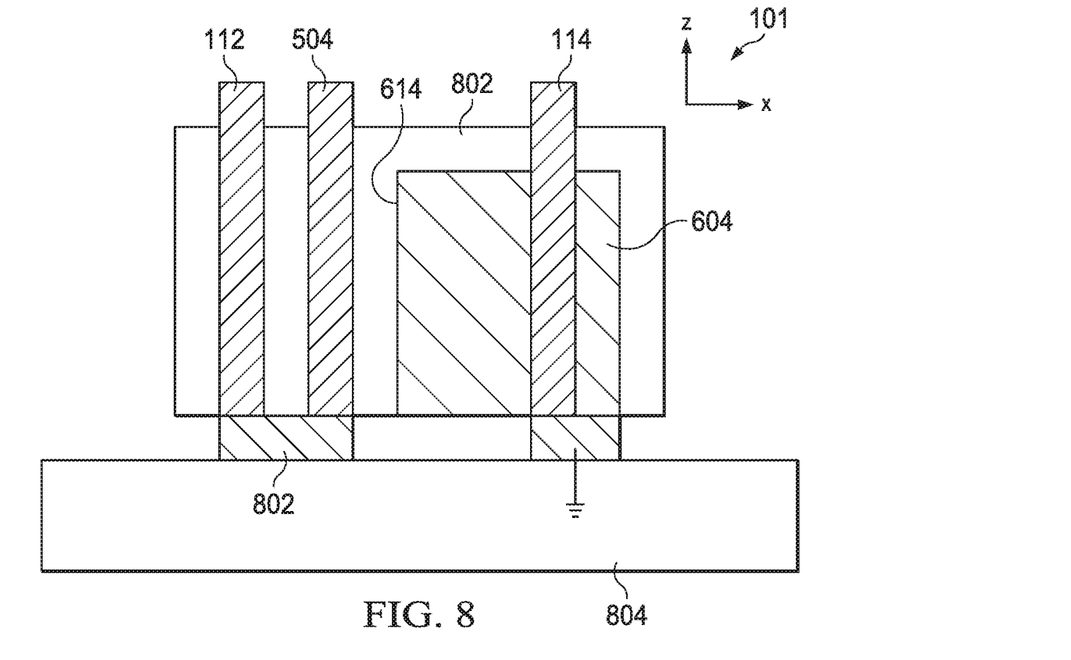
FIG. 8 shows an illustrative contactor in accordance with various examples.

FIG. 8 shows an illustrative contactor 802, with the metal block 604 and the ground pin 114 as described in the embodiments of FIG. 6 and FIG. 7. The embodiment of FIG. 8 includes the signal pin 112 and the signal pin 504 as described in the embodiment of FIG. 5. As in the embodiment of FIG. 5, the signal pin 112 and the signal pin 504 are electrically connected to each other by way of a pad 802 on a circuit board 804. The distance of the signal pin 504 from the side 614 of the metal block 604 may be chosen based upon impedance matching, and the signal pin 112 may be less than 100 microns from the signal pin 504.

Figure 9:
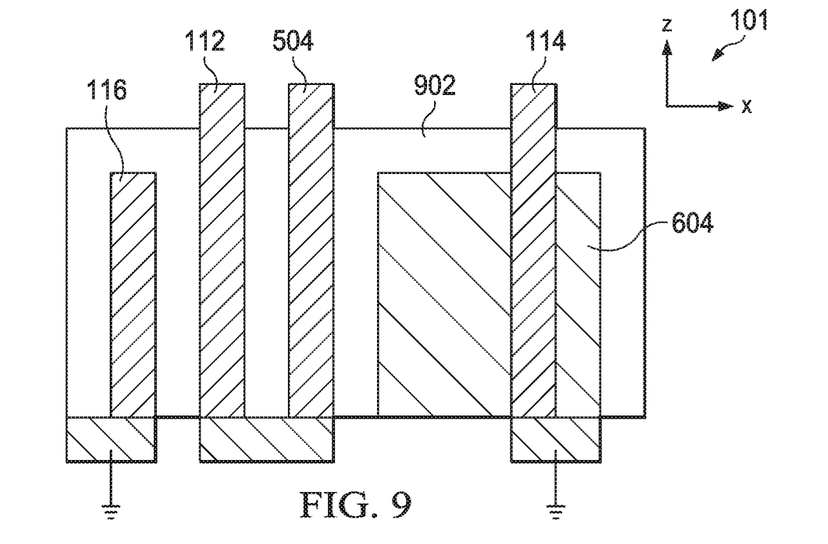
FIG. 9 shows an illustrative contactor in accordance with various examples.

FIG. 9 shows an illustrative contactor 902, with the signal pin 112, the signal pin 504, and the metal block 604 as described in the embodiment of FIG. 8. The embodiment of FIG. 9 includes the short ground pin 116 as described in previous embodiments, such as for example the embodiment illustrated in FIG. 6.

Figure 10:
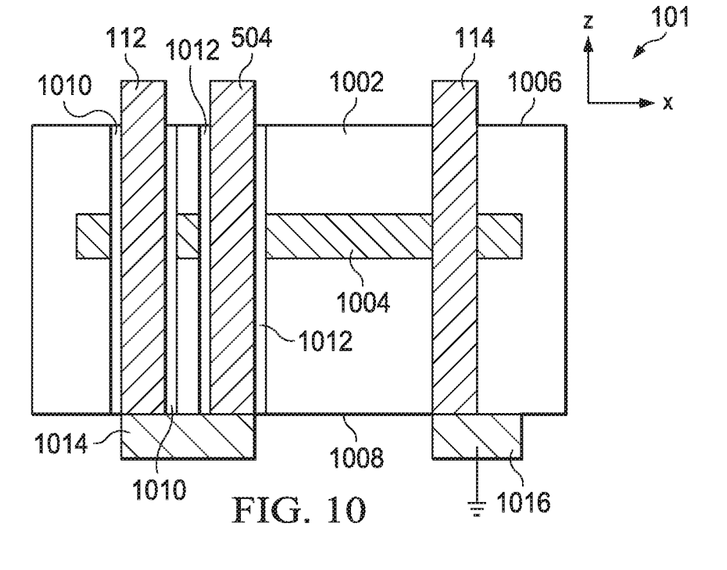
FIG. 10 shows an illustrative contactor in accordance with various examples.

FIG. 10 shows an illustrative contactor 1002. Inserted in parallel holes within the contactor 1002 are the ground pin 114, the signal pin 112, and the signal pin 504 as described in previous disclosed embodiments. Within the contactor 1002 is a metal plane 1004. FIG. 10 shows the metal plane 1004 parallel to a first surface 1006 and a second surface 1008 of the contactor 1002. With respect to the coordinate system 101 illustrated in FIG. 10, the metal plane 1004 lies in the x-y plane. However, the metal plane 1004, as well as other metal planes to be discussed in further embodiments, need not be parallel to the first and second surfaces of a contactor. Furthermore, the metal plane 1004, as well as other metal planes to be discussed in further embodiments, need not be planar in shape.

Holes are formed or drilled in the metal plane 1004. A first hole in the metal plane 1004 is aligned with the hole in the contactor 1002 that receives the ground pin 114, a second hole in the metal plane 1004 is aligned with the hole in contactor 1002 that receives the signal pin 112, and a third hole in the metal plane 1004 is aligned with the hole in contactor 1002 that receives the signal pin 504.

The ground pin 114 is in electrical contact with the metal plate 1004. An insulating sleeve (or air gap) 1010 insulates the signal pin 112 from the metal plane 1004, and an insulating sleeve (or air gap) 1012 insulates the signal pin 504 from the metal plane 1004. The signal pins 112 and 504 are electrically connected to one another by way of a pad 1014. The sleeve 1010 may comprise concentric metal cylinders filled with an insulator between the two cylinders. Similar remarks may apply to the sleeve 1012.

With the ground pin 114 grounded by way of a pad 1016, the metal plane 1004 is also grounded because it is electrically connected to the ground pin 114. In practice, there may be multiple metal planes similar to that of the metal plane 1004, each one having holes to surround the signal pins 112 and 504 and their respective insulating sleeves (if insulating sleeves are used), but are not shown for ease of illustration. Multiple metal planes such as the metal plane 1004 help mitigate interference from RF signals propagating along the signal pins 112 and 504.

Figure 11:
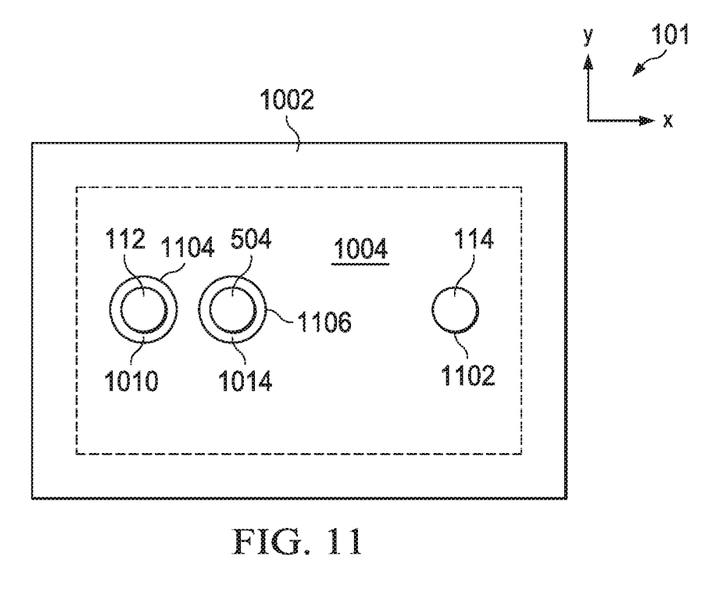
FIG. 11 shows an illustrative contactor in accordance with various examples.

FIG. 11 shows the illustrative contactor 1002 of FIG. 10, but with an orientation looking down into the first surface 1006 of the contactor 1002 as indicated by the coordinate system 101 in FIG. 11. The x-y plane lies in the page of the drawing with the z-axis pointing out of the page of the drawing. The outlines of the holes drilled within the contactor 1002 are labeled 1102, 1104, and 1106.

Figure 12:
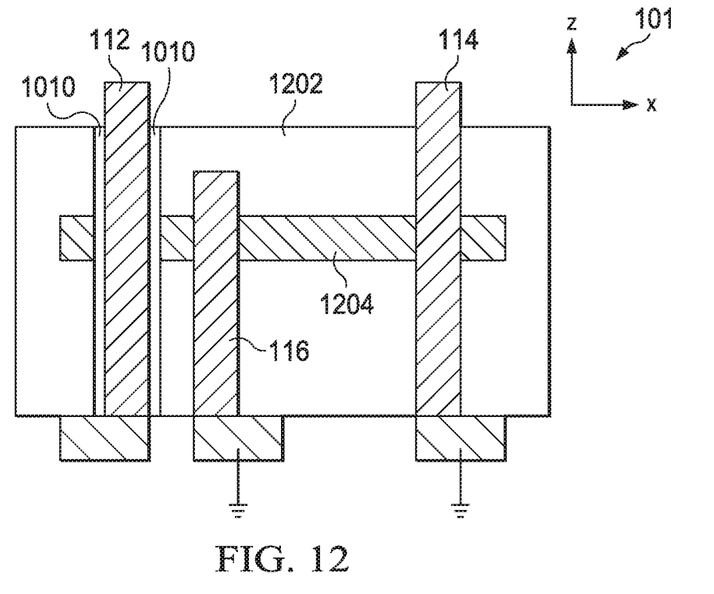
FIG. 12 shows an illustrative contactor in accordance with various examples.

FIG. 12 shows an illustrative contactor 1202, with three parallel holes for receiving the ground pin 114 and the signal pin 112 as described in FIG. 10, and a short ground pin 116, for example as described in the embodiment of FIG. 9. The metal plane 1204 in FIG. 12 is similar to the metal plane 1004 of FIG. 10. The hole in the contactor 1202 receiving the short ground pin 116 is aligned with a hole in the metal plane 1204, where the hole in the metal plane 1204 is such that the short ground pin 116 is in electrical contact with the metal plane 1204. The short ground pin 116 is grounded as in the other embodiments. In the particular embodiment of FIG. 12, the short ground pin 116 is to the right of the signal pin 112 so that it is positioned between the signal pin 112 and the ground pin 114. For some embodiments, the short ground pin 116 may be to the left of the signal pin 112. The short ground pin 116 and the signal pin 112 may be separated by less than 100 microns.

Figure 13:
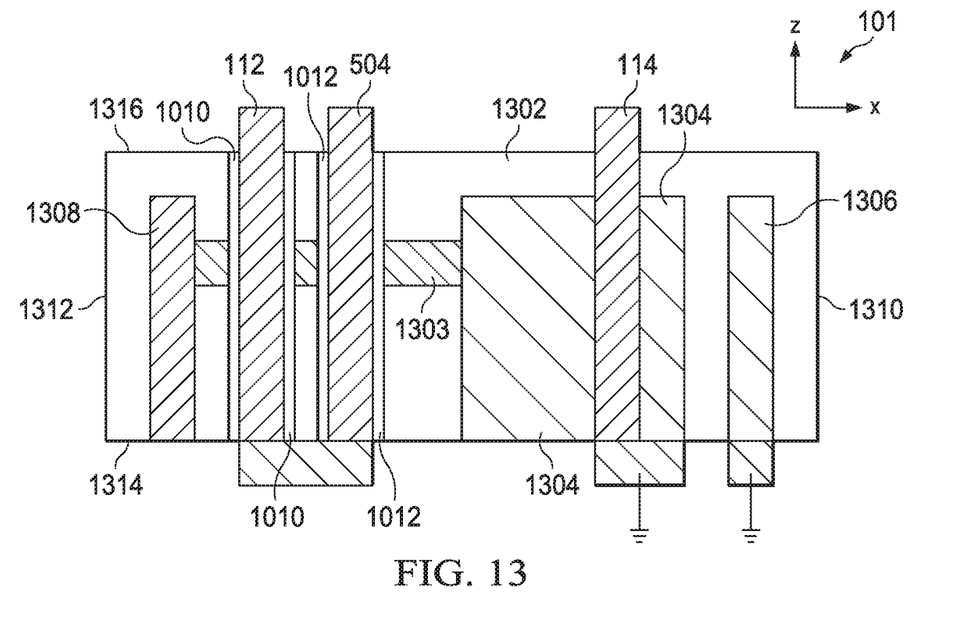
FIG. 13 shows an illustrative contactor in accordance with various examples.

FIG. 13 shows an illustrative contactor 1302. The contactor 1302 has parallel holes for receiving the signal pin 112, the signal pin 504, and the ground pin 114 as described in previously disclosed embodiments. Within the contactor 1302 is a metal plane 1303 similar to the metal plane 1204 of FIG. 12. However, the metal plane 1303 need not extend to the ground pin 114. As in previously disclosed embodiments, the sleeve 1010 insulates the signal pin 112 from the metal plane 1303, and the sleeve 1012 insulates the signal pin 504 from the metal plane 1303. A metal block 1304 is similar to the metal block 604 of the embodiment illustrated in FIG. 9, where the metal block 1304 has a hole aligned with a hole in the contactor 1302 for receiving the ground pin 114. The metal block 1304 is in electrical contact with the metal plane 1303.

Shown in FIG. 13 is a fourth metal wall 1306, and a third metal wall 1308. In some embodiments, the fourth metal wall 1306 may be physically connected to the metal block 1304, or may be part of the metal block 1304. In the particular embodiment of FIG. 13, the fourth metal wall 1306 is shown as a separate component from the metal block 1304. However, both the fourth metal wall 1306 and the metal block 1304 are grounded so that they are electrically connected to one another. The third metal wall 1308 is electrically connected to the metal plane 1303.

The fourth metal wall 1306 is parallel to a sixth surface 1310 of the contactor 1302, and the third metal wall 1308 is parallel to a fifth surface 1312 of the contactor 1302. FIG. 13 shows the fourth metal wall 1306 and the third metal wall 1308 extending to a second surface 1314 of the contactor 1302. The fourth metal wall 1306 and the third metal wall 1308 extend within a first surface 1316 of the contactor 1302.

Figure 14:
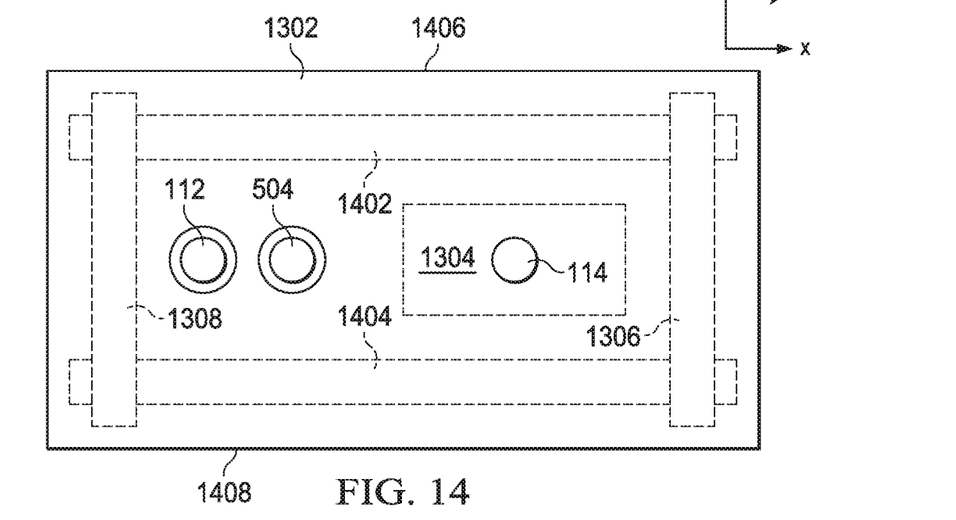
FIG. 14 shows an illustrative contactor in accordance with various examples.

FIG. 14 shows the illustrative contactor 1302, but with respect to an orientation looking down into the first surface 1316 of the contactor 1302 as indicated by the coordinate system 101 in FIG. 14, with the x-y plane in the page of the drawing and with the z-axis pointing out of the page of the drawing.

FIG. 14 illustrates additional structure not shown in the illustration of FIG. 13, but for ease of illustration FIG. 14 does not show the metal plane 1303. Shown in FIG. 14 are a second metal wall 1402 and a first metal wall 1404. The second metal wall 1402 is parallel to a fourth surface 1406 of the contactor 1302, and the first metal wall 1404 is parallel to a third surface 1408 of the contactor 1302. Both the second metal wall 1402 and the first metal wall 1404 extend within the first surface 1316 of the contactor 1302. The second metal wall 1402 is electrically connected to the third metal wall 1308 and to the fourth metal wall 1306. The first metal wall 1404 is electrically connected to the third metal wall 1308 and to the fourth metal wall 1306. Accordingly, the combination of the metal walls 1306, 1308, 1402, and 1404 forms a cage surrounding the pins within the contactor 1302. This helps to further mitigate interference from RF noise signals during testing.

In the particular embodiment of FIG. 14, the second metal wall 1402 and the first metal wall 1404 each extend to the second surface 1314 of the contactor 1302. FIG. 14 shows that the metal block 1304 does not extend to the second metal wall 1402 and to the first metal wall 1404. Accordingly, the combination of the fourth metal wall 1306, the third metal wall 1308, the second metal wall 1402, and the first metal wall 1404 may be described as surrounding the sides of the metal block 1304. In some embodiments, the metal block 1304 may extend to the second metal wall 1402 and to the first metal wall 1404.

Some embodiments may have a short ground pin, such for example, the short ground pin 116 of previous embodiments, situated where the signal pin 504 is illustrated in the embodiments of FIG. 13 and FIG. 14.

In the embodiments illustrated in the above-described figures, the ground pins and the short ground pins are coupled to a ground, but as discussed with respect to FIG. 1, separate grounds are illustrated to indicate that their voltage potentials may differ in phase from one another. The signal pins in the illustrated embodiments are coupled to the RF generator 104 (not explicitly shown in all embodiments). The illustrated embodiments are not drawn to scale. Furthermore, for ease of illustration only several pins and one metal plane have been shown in any one particular contactor embodiment, although in practice a contactor may include many pins as well as multiple metal planes.

Figure 15:
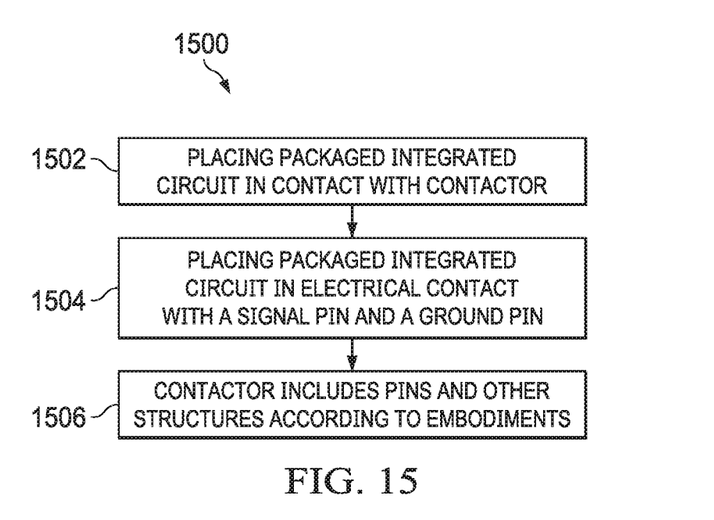
FIG. 15 shows an illustrative method of testing a packaged integrated circuit in accordance with various examples.

A method of manufacture for fabricating and testing packaged integrated circuits includes a contactor having pins, metal blocks (if any), and metal planes (if any), such as the illustrative system 100 with the contactor 106. FIG. 15 shows an illustrative method 1500 to test a packaged integrated circuit as part of a method of manufacture. In step 1502, a packaged integrated circuit, e.g., the illustrative DUT 102, is placed in contact with a contactor, e.g., the illustrative contactor 106. In step 1504, the packaged integrated circuit is placed in electrical contact with a signal pin, e.g., the illustrative signal pin 112, and with a ground pin, e.g., the illustrative ground pin 114. Step 1506 specifies that the contactor is according to the previously disclosed embodiments, such as for example any of the illustrative contactors 106, 206, 302, 402, 502, 602, 702, 802, 902, 1002, 1202, or 1302.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
   a contactor having a first surface, a second surface, a first hole, a second hole parallel to the first hole, and a third hole parallel to the first hole;
   a first signal pin held in the first hole of the contactor, extending to at least the second surface of the contactor, and extending to at least the first surface of the contactor;
   a first ground pin held in the third hole of the contactor, extending to at least the second surface of the contactor, and extending to at least the first surface of the contactor; and
   a second ground pin held in the second hole of the contactor, extending to at least the second surface of the contactor, and extending toward, but not to, at least the first surface of the contactor.

2. The system of claim 1, wherein the contactor comprises a plate to receive an integrated circuit package.

3. The system of claim 1, wherein the second hole is separated from the first hole by not more than 100 microns.

4. The system of claim 3, further comprising:
   a device comprising a signal pad in electrical contact with the first signal pin and a ground pad in electrical contact with the first ground pin.

5. The system of claim 4, wherein the device comprises:
   a ball grid array integrated circuit package; and
   a signal ball on the ball grid array integrated circuit package and forming the signal pad of the device.

6. The system of claim 5, wherein the device comprises:
   a quad flatpack no leads integrated circuit package; and
   a signal device pin on the quad flatpack no leads integrated circuit package and forming the signal pad of the device.

7. The system of claim 1, further comprising a circuit board, the circuit board comprising:
   a signal pad in electrical contact with the first signal pin;
   a first ground pad in electrical contact with the first ground pin; and
   a second ground pad in electrical contact with the second ground pin.

8. The system of claim 7, further comprising:
   a ground at ground potential, the ground in electrical contact with the second ground pad of the circuit board.

9. The system of claim of claim 8, further comprising:
   a radio frequency generator comprising an output port coupled to the signal pad of the circuit board and to the first ground pad of the circuit board.

10. The system of claim 1, wherein the contactor further comprises a metal plane, the metal plane having a first hole aligned with the first hole of the contactor, a second hole aligned with the second hole of the contactor.

11. The system of claim 10, further comprising:
    an insulating sleeve inserted in the first hole of the contactor, wherein the first signal pin is inserted in the insulating sleeve.

12. A system comprising:
    a contactor having a first surface, a second surface, a first hole, a second hole parallel to the first hole, and a third hole parallel to the first hole;
    a first signal pin held in the first hole of the contactor, extending to at least the second surface of the contactor, and extending to at least the first surface of the contactor;

a ground pin held in the third hole of the contactor, extending to at least the second surface of the contactor, and extending to at least the first surface of the contactor; and a metal block extending to the second surface of the contactor and extending within the first surface of the contactor, the metal block having a hole aligned with the second hole of the contactor, and a side parallel to the first hole of the contactor.

13. A system comprising:

a contactor having a first surface, a second surface, a first hole, a second hole parallel to the first hole, and a third hole parallel to the first hole;

a first signal pin held in the first hole of the contactor, extending to at least the second surface of the contactor, and extending to at least the first surface of the contactor;

a ground pin held in the third hole of the contactor, extending to at least the second surface of the contactor, and extending to at least the first surface of the contactor, wherein the contactor further comprises:

a third surface;

a fourth surface;

a fifth surface, a sixth surface;

a metal plane having a first hole aligned with the first hole of the contactor;

a metal block, the metal block extending to the second surface of the contactor, extending within the first surface of the contactor, having a side parallel to the first hole of the contactor, having a hole aligned with the second hole of the contactor, and wherein the metal block is in electrical contact with the metal plane;

a first metal wall parallel to the third surface, the first metal wall extending to the second surface of the contactor, and extending within the first surface of the contactor;

a second metal wall in electrical contact with the first metal wall and parallel to the fourth surface, the second metal wall extending to the second surface of the contactor, and extending within the first surface of the contactor;

a third metal wall in electrical contact with the first metal wall and parallel to the fifth surface, the third metal wall extending to the second surface of the contactor, and extending within the first surface of the contactor;

a fourth metal wall in electrical contact with the first metal wall and parallel to the sixth surface, the fourth metal wall extending to the second surface of the contactor, and extending within the first surface of the contactor;

wherein the first, second, third, and fourth metal walls intersect to surround sides of the metal block;

a first signal pin held in the first hole of the contactor, extending to at least the second surface of the contactor, and extending to at least the first surface of the contactor, wherein the first signal pin is electrically insulated from the metal plane; and a ground pin held in the hole of the metal block, extending to at least the second surface of the contactor, and extending to at least the first surface of the contactor, wherein the ground pin is in electrical contact with the metal block.

14. A system comprising:

a packaged integrated circuit in contact with a contactor; and the packaged integrated circuit in electrical contact with a first signal pin, a first ground pin and a second ground pin;

wherein the contactor has a first surface, a second surface, a first hole, a second hole parallel to the first hole, and a third hole parallel to the first hole;

wherein the first signal pin is held in the first hole of the contactor, extends to at least the second surface of the contactor, and extends to at least the first surface of the contactor;

wherein the first ground pin is held in the third hole of the contactor, extends to at least the second surface of the contactor, and extends to at least the first surface of the contactor; and wherein the second ground pin is held in the second hole of the contactor, extends to at least the second surface of the contactor, and extends toward, but not to, at least the first surface of the contactor.

15. The system of claim 14, wherein the contactor comprises a metal plane;

wherein the metal plane has a first hole aligned with the first hole of the contactor, a second hole aligned with the second hole of the contactor, and a third hole aligned with the third hole of the contactor;

wherein the first signal pin is held in the first hole of the contactor, extends to at least the second surface of the contactor, and extends to at least the first surface of the contactor, wherein the first signal pin is electrically insulated from the metal plane; and wherein the ground pin is held in the third hole of the contactor, extends to at least the second surface of the contactor, and extends to at least the first surface of the contactor, wherein the ground pin is in electrical contact with the metal plane.

16. The system of claim 14, the contactor further comprising:

a third surface;

a fourth surface;

a fifth surface;

a sixth surface;

a first hole;

a second hole parallel to the first hole;

a metal plane, a metal block, a first metal wall, a second metal wall, a third metal wall, and a fourth metal wall:

wherein the metal plane has a first hole aligned with the first hole of the contactor;

wherein the metal block extends to the second surface of the contactor, extends within the first surface of the contactor, has a side parallel to the first hole of the contactor, has a hole aligned with the second hole of the contactor, and wherein the metal block is in electrical contact with the metal plane;

wherein the first metal wall is parallel to the third surface, extends to the second surface of the contactor, and extends within the first surface of the contactor;

wherein the second metal wall is in electrical contact with the first metal wall and is parallel to the fourth surface, extends to the second surface of the contactor, and extends within the first surface of the contactor;

wherein the third metal wall is in electrical contact with the first metal wall and is parallel to the fifth surface, extends to the second surface of the contactor, and extends within the first surface of the contactor;

wherein the fourth metal wall is in electrical contact with the first metal wall and is parallel to the sixth surface, extends to the second surface of the contactor, and extends within the first surface of the contactor;

wherein the first, second, third, and fourth metal walls intersect to surround sides of the metal block;

wherein the first signal pin is held in the first hole of the contactor, extends to at least the second surface of the contactor, and extends to at least the first surface of the contactor, wherein the first signal pin is electrically insulated from the metal plane; and wherein the ground pin is held in the hole of the metal block, extends to at least the second surface of the contactor, and extends to at least the first surface of the contactor, wherein the ground pin is in electrical contact with the metal block.

17. A system comprising:

a packaged integrated circuit in contact with a contactor; and the packaged integrated circuit in electrical contact with a first signal pin and a ground Pin;

wherein the contactor has a first surface, a second surface, a first hole, a second hole parallel to the first hole, and a third hole parallel to the first hole;

wherein the first signal pin is held in the first hole of the contactor, extends to at least the second surface of the contactor, and extends to at least the first surface of the contactor;

wherein the ground pin is held in the third hole of the contactor, extends to at least the second surface of the contactor, and extends to at least the first surface of the contactor; and wherein the contactor comprises a metal block, the metal block extending to the second surface of the contactor and extending within the first surface of the contactor, the metal block having a hole aligned with the second hole of the contactor, and wherein the contactor includes a side parallel to the first hole of the contactor.

18. A system comprising:

a packaged integrated circuit in contact with a contactor; and the packaged integrated circuit in electrical contact with a first signal pin and a first ground pin, each pin being moveable and under the tension of a spring;

wherein the contactor has a first surface, a second surface, a first hole, a second hole parallel to the first hole, and a third hole parallel to the first hole;

wherein the first signal pin is held in the first hole of the contactor, extends to at least the second surface of the contactor, and extends to at least the first surface of the contactor;

wherein the first ground pin is held in the third hole of the contactor, extends to at least the second surface of the contactor, and extends to at least the first surface of the contactor; and a second ground pin, held in the second hole of the contactor, extends to at least the second surface of the contactor, and extends toward, but not to, at least the first surface of the contactor.

19. The system of claim 18, wherein the second hole and the third hole are separated from the first hole by no more than 100 microns.

* * * * *